US00RE49747E

(19) United States
(12) Reissued Patent
Kim et al.

(10) Patent Number: US RE49,747 E
(45) Date of Reissued Patent: Dec. 5, 2023

(54) MULTILAYER CERAMIC ELECTRONIC COMPONENT TO BE EMBEDDED IN BOARD, MANUFACTURING METHOD THEREOF, AND PRINTED CIRCUIT BOARD HAVING MULTILAYER CERAMIC ELECTRONIC COMPONENT EMBEDDED THEREIN

(71) Applicant: SAMSUNG ELECTRO-MECHANICS CO., LTD., Suwon-si (KR)

(72) Inventors: Hye Seong Kim, Suwon-si (KR); Hee Jung Jung, Suwon-si (KR)

(73) Assignee: SAMSUNG ELECTRO-MECHANICS CO., LTD., Suwon-si (KR)

(21) Appl. No.: 17/522,163

(22) Filed: Nov. 9, 2021

Related U.S. Patent Documents

Reissue of:
(64) Patent No.: 9,384,896
Issued: Jul. 5, 2016
Appl. No.: 14/144,312
Filed: Dec. 30, 2013

(30) Foreign Application Priority Data

Sep. 24, 2013 (KR) ..... 10-2013-0113360

(51) Int. Cl.
*H01G 4/232* (2006.01)
*H01G 2/06* (2006.01)
(Continued)

(52) U.S. Cl.
CPC ..... *H01G 4/232* (2013.01); *H01G 2/06* (2013.01); *H01G 4/30* (2013.01); *H05K 1/185* (2013.01);
(Continued)

(58) Field of Classification Search
CPC ..... H01G 4/232; H01G 2/06; H01G 4/30; H01G 4/2325; H05K 1/185; H05K 2201/10015; H05K 3/46; Y10T 29/435
See application file for complete search history.

(56) References Cited

U.S. PATENT DOCUMENTS 8,228,663 B2 7/2012 Takeuchi et al.
8,654,505 B2 * 2/2014 Tahara ..... H01G 4/12 361/321.2
(Continued)

FOREIGN PATENT DOCUMENTS

JP 2001-332436 A 11/2001
JP 2006237078 A 9/2006
(Continued)

OTHER PUBLICATIONS

Office Action issued on Sep. 1, 2014 in the corresponding Korean patent application No. 10-2013-0113360.
(Continued)

*Primary Examiner* — Kenneth Whittington
(74) *Attorney, Agent, or Firm* — Morgan, Lewis & Bockius LLP

(57) ABSTRACT

There are provided a multilayer ceramic electronic component to be embedded in a board and a manufacturing method thereof, and particularly, a multilayer ceramic electronic component to be embedded in a board, in which a thickness of a ceramic body in an entire chip is increased by not allowing for an increase in a thickness of an external electrode while forming a band surface of the external electrode to have a predetermined length or greater for connecting the external electrode to an external wiring through a via hole, such that chip strength may be improved and the occurrence of damage such as breakage, or the like
(Continued)

may be prevented, and a manufacturing method thereof, may be provided.

20 Claims, 6 Drawing Sheets

(51) Int. Cl.
*H01G 4/30* (2006.01)
*H05K 1/18* (2006.01)

(52) U.S. Cl.
CPC . *H01G 4/2325* (2013.01); *H05K 2201/10015* (2013.01); *Y10T 29/435* (2015.01)

(56) References Cited

U.S. PATENT DOCUMENTS 8,754,335 B2 6/2014 Sato et al.
2005/0057886 A1* 3/2005 Mruz ..... H01G 4/40 361/306.2
2006/0126264 A1* 6/2006 Yoshii ..... H01G 4/232 361/728
2007/0025056 A1* 2/2007 Nishikawa et al. . H01G 4/0085 361/303
2008/0000061 A1* 1/2008 Jeong et al. ..... H01G 4/232 29/25.41
2009/0002920 A1* 1/2009 Itamura ..... H01G 4/2325 361/321.3
2009/0226705 A1* 9/2009 Motoki ..... H01G 4/30 428/323
2009/0323253 A1* 12/2009 Kobayashi ..... H01G 4/005 427/79
2010/0118467 A1 5/2010 Takeuchi et al.
2010/0123994 A1* 5/2010 Nishisaka ..... H01G 4/232 361/306.3
2010/0128411 A1* 5/2010 Onishi ..... H01G 4/30 361/302
2011/0255209 A1 10/2011 Ishida et al.
2011/0266040 A1 11/2011 Kim et al.
2012/0018204 A1* 1/2012 Sato ..... H01G 4/232 361/321.1
2013/0208401 A1* 8/2013 Shirakawa et al. .... H01G 13/06 361/305

FOREIGN PATENT DOCUMENTS

JP 2010-118499 A 5/2010
JP 2011228334 A 11/2011
JP 2013-165180 A 8/2013
KR 1020110122008 A 11/2011
WO 2006/110287 A1 10/2006

OTHER PUBLICATIONS

Notice of Office Action issued in corresponding Japanese Patent Application No. 2013-269267, mailed on Sep. 1, 2015; with English translation.

* cited by examiner

MULTILAYER CERAMIC ELECTRONIC COMPONENT TO BE EMBEDDED IN BOARD, MANUFACTURING METHOD THEREOF, AND PRINTED CIRCUIT BOARD HAVING MULTILAYER CERAMIC ELECTRONIC COMPONENT EMBEDDED THEREIN

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED APPLICATIONS

This application *is the reissue application of U.S. Pat. No. 9,384,896 B2, which issued on Jul. 5, 2016, which was filed as U.S. patent application Ser. No. 14/144,312 on Dec. 30, 2013, which* claims the priority of Korean Patent Application No. 10-2013-0113360 filed on Sep. 24, 2013, in the Korean Intellectual Property Office, the [disclosure] *disclosures* of which [is] *are* incorporated herein by reference *in their entirety*.

BACKGROUND

The present disclosure relates to a multilayer ceramic electronic component to be embedded in a board, a manufacturing method thereof, and a printed circuit board having a multi-layer ceramic electronic component embedded therein.

As electronic circuits have become highly densified and highly integrated, a mounting space for passive elements mounted on a printed circuit board (PCB) has become insufficient, and in order to solve this problem, ongoing efforts have been made to implement components able to be installed within a board, i.e., embedded devices. In particular, various methods have been proposed for installing a multilayer ceramic electronic component used as a capacitive component within a board.

In one of a variety of methods of installing a multilayer ceramic electronic component within a board, the same dielectric material used for a multilayer ceramic electronic component is used as a material for a board and a copper wiring, or the like, is used as an electrode. Other methods for implementing a multilayer ceramic electronic component to be embedded in a board include a method of forming the multilayer ceramic electronic component to be embedded in the board by forming a polymer sheet having high-k dielectrics and a dielectric thin film within the board, a method of installing a multilayer ceramic electronic component within a board, and the like.

In general, a multilayer ceramic electronic component includes a plurality of dielectric layers made of a ceramic material, and internal electrodes interposed between the dielectric layers. By disposing such a multilayer ceramic electronic component within a board, an embedded multilayer ceramic electronic component having high capacitance may be implemented.

After the multilayer ceramic electronic component is embedded in the board, a via hole is formed so that an external electrode of the multilayer ceramic electronic component penetrates through a resin to be exposed using laser, and the via hole is filled with a copper plating to electrically connect an external wiring and the external electrode of the multilayer ceramic electronic component to each other.

In this case, in order to connect the external electrode of the multilayer ceramic electronic component and the external wiring through the via hole, there is a need to form a band surface of the external electrode having a predetermined length or greater. However, in the case in which the band surface of the external electrode having the predetermined length or greater is formed using an existing dipping method, or the like, a thickness of the external electrode becomes thick, such that a ceramic body having a sufficient thickness may not be secured by an increase in the thickness of the external electrode. Since the multilayer ceramic electronic component has a thickness of an entire chip which is thin compared to a non-multilayer ceramic electronic component, in the case in which the band surface of the external electrode is formed so as to have a thick thickness, the thickness of the ceramic body becomes extremely small, such that a chip strength may become weak and damage may be caused.

In addition, when a generated step becomes large by the thickness of the ceramic body and the external electrode of the multilayer ceramic electronic component, gap between the multilayer ceramic electronic component and a film becomes large, such that occurrence probability of de-lamination is further increased. Therefore, in order to decrease the above-mentioned de-lamination, it is required to decrease the thickness of the external electrode.

RELATED ART DOCUMENT (Patent Document 1) Korean Patent Laid-Open Publication No. 2011-0122008

SUMMARY

An aspect of the present disclosure may provide a multilayer ceramic electronic component to be embedded in a board, in which a thickness of a ceramic body in an entire chip is increased by not allowing for an increase in a thickness of an external electrode while forming a band surface of the external electrode to have a predetermined length or greater for connecting the external electrode to an external wiring through a via hole, a manufacturing method thereof, and a printed circuit board having a multilayer ceramic electronic component embedded therein.

According to an aspect of the present disclosure, a multilayer ceramic electronic component to be embedded in a board may include: a ceramic body including dielectric layers and having both end surfaces in a length direction, both surfaces in a width direction, and both surfaces in a thickness direction; first and second internal electrodes formed to be alternately exposed to the both end surfaces of the ceramic body in the length direction, having the dielectric layers interposed therebetween; and a first external electrode electrically connected to the first internal electrodes and a second external electrode electrically connected to the second internal electrodes, the first and second external electrodes being formed on the both end surfaces of the ceramic body in the length direction, wherein the first and second external electrodes may include first and second base electrodes formed on the both end surfaces of the ceramic body in the length direction, conductive thin film layers formed on both surfaces of the ceramic body in the thickness direction, and plating layers formed on the first and second base electrodes and the conductive thin film layers.

The conductive thin film layers may have a thickness of 0.1 to 5000 nm.

When a thickness of the conductive thin film layers is defined as tf and a thickness of the plating layers formed on the conductive thin film layers is defined as tp, $1.5 \leq tp/tf \leq 10000$ may be satisfied.

The conductive thin film layers may include at least one selected from a group consisting of copper (Cu), nickel (Ni), palladium (Pd), platinum (Pt), gold (Au), silver (Ag), iron (Fe), titanium (Ti), and carbon (C).

The conductive thin film layers may be formed to be separated from each other on both end portions of one surface of the ceramic body in the thickness direction.

The conductive thin film layers may be formed to be connected to the first and second base electrodes.

The conductive thin film layers may be formed to be extended to the first and second base electrodes from the both surfaces of the ceramic body in the thickness direction.

When widths of band surfaces of the first and second external electrodes formed on the conductive thin film layers of one surface of the ceramic body in the thickness direction are defined as BW, each of BW may be 25% or more of a length of the ceramic body.

The ceramic body may have a thickness of 60% or more of an overall thickness of the multilayer ceramic electronic component including the external electrodes.

An overall thickness of the multilayer ceramic electronic component including the external electrodes may be 300 μm or less.

According to another aspect of the present disclosure, a manufacturing method of a multilayer ceramic electronic component to be embedded in a board, the manufacturing method may include: preparing a plurality of ceramic sheets; forming an internal electrode pattern on each of the ceramic sheets using a conductive paste; forming a ceramic body including first and second internal electrodes opposed to each other therein by stacking the ceramic sheets having the internal electrode pattern formed thereon; compressing and sintering the ceramic body; and forming first and second external electrodes to contact the first and second internal electrodes exposed to both end surfaces of the ceramic body in a length direction to thereby be electrically connected thereto, wherein in the forming of the first and second external electrodes, first and second base electrodes are formed on the both end surfaces of the ceramic body in the length direction, conductive thin film layers are formed on both surfaces of the ceramic body in a thickness direction, and plating layers are formed on the first and second base electrodes and the conductive thin film layers.

The forming of the conductive thin film layers may be performed by at least one method selected from a group consisting of a sputtering method, a printing method, and an electroless plating method.

The conductive thin film layers may have a thickness of 0.1 to 5000 nm.

When a thickness of the conductive thin film layers is defined as tf and a thickness of the plating layers formed on the conductive thin film layers is defined as tp, $1.5 \leq tp/tf \leq 10000$ may be satisfied.

The conductive thin film layers may include at least one selected from a group consisting of copper (Cu), nickel (Ni), palladium (Pd), platinum (Pt), gold (Au), silver (Ag), iron (Fe), titanium (Ti), and carbon (C).

The conductive thin film layers may be formed to be separated from each other on both end portions of one surface of the ceramic body in the thickness direction.

The conductive thin film layers may be formed to be connected to the first and second base electrodes.

According to another aspect of the present disclosure, a printed circuit board having a multilayer ceramic electronic component to be embedded in a board may include: an insulation substrate; and a ceramic body including dielectric layers and having both end surfaces in a length direction, both surfaces in a width direction, and both surfaces in a thickness direction; first and second internal electrodes formed to be alternately exposed to the both end surfaces of the ceramic body in the length direction, having the dielectric layers interposed therebetween; and a first external electrode electrically connected to the first internal electrodes and a second external electrode electrically connected to the second internal electrodes, the first and second external electrodes being formed on the both end surfaces of the ceramic body in the length direction, wherein the first and second external electrodes may include first and second base electrodes formed on the both end surfaces of the ceramic body in the length direction, conductive thin film layers formed on the both surfaces of the ceramic body in the thickness direction, and plating layers formed on the first and second base electrodes and the conductive thin film layers.

The conductive thin film layers may have a thickness of 0.1 to 5000 nm.

When a thickness of the conductive thin film layers is defined as tf and a thickness of the plating layers formed on the conductive thin film layer is defined as tp, $1.5 \leq tp/tf \leq 10000$ may be satisfied.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
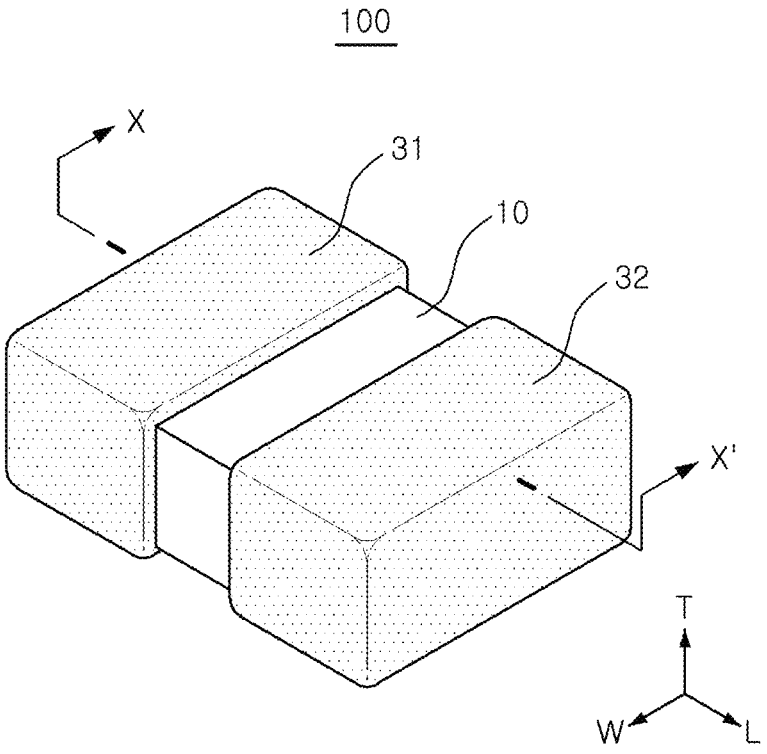
FIG. 1 is a perspective view showing a multilayer ceramic electronic component to be embedded in a board according to an exemplary embodiment of the present disclosure.

Hereinafter, embodiments of the present disclosure will be described in detail with reference to the accompanying drawings.

The disclosure may, however, be embodied in many different forms and should not be construed as being limited to the embodiments set forth herein.

Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Directions of a hexahedron are defined in order to clearly describe the embodiments of the present disclosure. "L", "W", and "T" indicated in drawings may refer to a 'length direction' a 'width direction' and a 'thickness direction', respectively. Here, the 'thickness direction' is the same as a direction in which dielectric layers are stacked, that is, a 'stacking direction'.

Multilayer Ceramic Electronic Component to be Embedded in a Board

Hereinafter, a multilayer ceramic electronic component to be embedded in a board according to an exemplary embodiment of the present disclosure will be described. Particularly, an embedded multilayer ceramic capacitor will be described. However, the present disclosure is not limited thereto.

Figure 2:
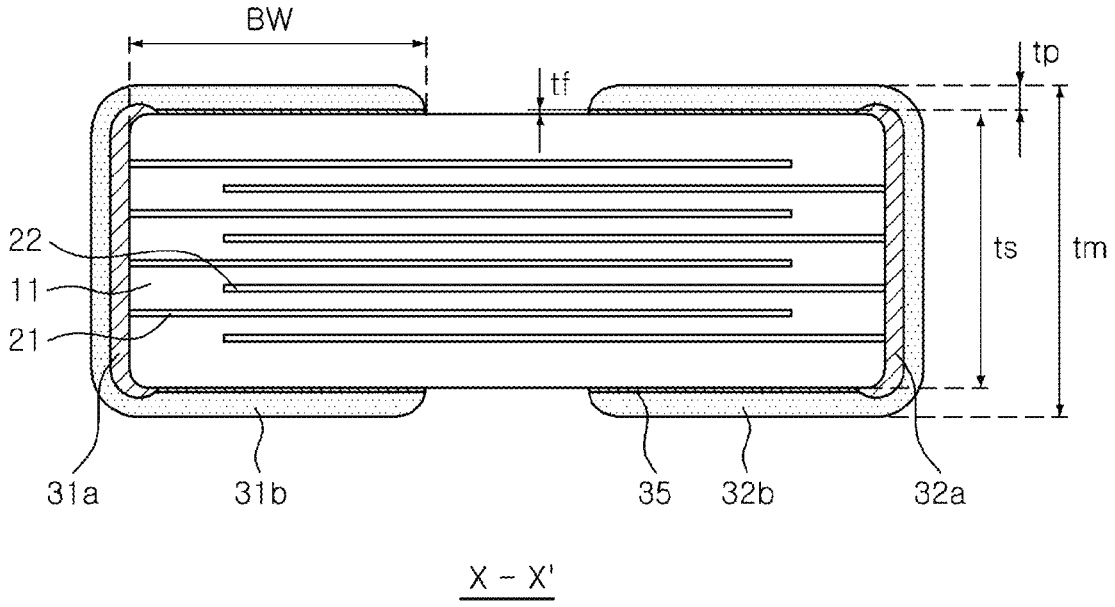
FIG. 2 is a cross-sectional view of the multilayer ceramic electronic component to be embedded in a board according to the exemplary embodiment of the present disclosure, taken along line X-X' of FIG. 1.
Figure 3:
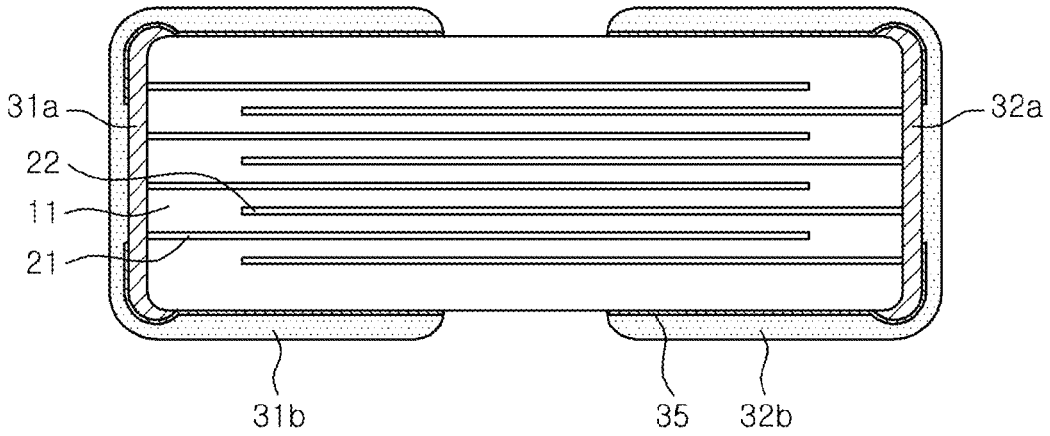
FIG. 3 is a cross-sectional view of the multilayer ceramic electronic component to be embedded in a board according to the exemplary embodiment of the present disclosure.

FIG. 1 is a perspective view showing a multilayer ceramic electronic component to be embedded in a board according to an exemplary embodiment of the present disclosure and FIGS. 2 and 3 are cross-sectional views taken along line X-X' of FIG. 1 showing the multilayer ceramic electronic component according to the exemplary embodiment of the present disclosure.

Referring to FIGS. 1 through 3, the multilayer ceramic electronic component 100 according to the exemplary embodiment of the present disclosure may include a ceramic body 10; first and second internal electrodes 21 and 22, and first and second external electrodes 31 and 32.

The ceramic body 10 may be formed in a hexahedral shape having both end surfaces in the length direction L, both surfaces in the width direction W, and both surfaces in the thickness direction T. The ceramic body 10 may be formed by stacking a plurality of dielectric layers 11 in the thickness direction T and then sintering the same, and a shape and a dimension of the ceramic body 10, and the number of the stacked dielectric layers 11 is not limited to those shown in the exemplary embodiment of the present disclosure.

In addition, the plurality of dielectric layers 11 configuring the ceramic body 10 may be in a sintered state. Adjacent dielectric layers 11 may be integrated so as not to confirm a boundary therebetween without using a scanning electron microscope (SEM).

The dielectric layer 11 may have a thickness capable of being arbitrarily changed according to a capacitance design of the multilayer ceramic electronic component 100 and may include a ceramic powder having a high dielectric constant, for example, a barium titanate ($BaTiO_3$) based or a strontium titanate ($SrTiO_3$) based powder, but the present disclosure is not limited thereto. In addition, the ceramic power may be added with various ceramic additives, organic solvents, plasticizers, binders, dispersing agents, or the like according to the object of the present disclosure.

An average particle diameter of the ceramic powder used for forming the dielectric layer 11 is not particularly limited, may be adjusted in order to achieve the object of the present disclosure, and for example, may be adjusted to 400 nm or less.

The first and second internal electrodes 21 and 22, a pair of electrodes having different polarities from each other, may be formed so as to be alternately exposed through both end surfaces of the length direction L of the ceramic body 10 according to the stacking direction of the dielectric layers 11 by printing a conductive paste including a conductive metal at a predetermined thickness on the plurality of dielectric layers 11 stacked in the thickness direction T, and may be electrically insulated from each other by the dielectric layer 11 disposed therebetween.

That is, the first and second internal electrodes 21 and 22 may be electrically connected to the first and second external electrodes 31 and 32 formed on both end surfaces of the ceramic body 10 in the length direction L through portions thereof alternately exposed through both end surfaces of the ceramic body 10.

Therefore, when a voltage is applied to the first and second external electrodes 31 and 32, charges are accumulated between the first and second internal electrodes 21 and 22 opposite to each other. In this case, a capacitance of the multilayer ceramic capacitor 100 is proportional to an area of a region in which the first and second internal electrodes 21 and 22 are overlapped with each other.

The first and second internal electrodes 21 and 22 may have widths determined according to an application thereof and may have the widths in a range of 0.2 to 1.0 μm determined in consideration of a size of the ceramic body 10, for example, but the present disclosure is not limited thereto.

In addition, the conductive metal included in the conductive paste forming the first and second internal electrodes 21 and 22 may be nickel (Ni), copper (Cu), palladium (Pd), silver (Ag), lead (Pb), platinum (Pt), or the like, or an alloy thereof, but the present disclosure is not limited thereto.

The first and second external electrodes 31 and 32 may be formed on both end surfaces of the ceramic body 10 in the length direction L and may be extended to both surfaces of the ceramic body 10 in the thickness direction T to thereby form band surfaces BW.

The first and second external electrodes 31 and 32 may include first and second base electrodes 31a and 32a formed on both end surfaces of the ceramic body 10 in the length direction L, conductive thin film layers 35 formed on both end surfaces in the thickness direction T of the ceramic body 10, and plating layers 31b and 32b formed on the first and second base electrodes 31a and 32a and the conductive thin film layers 35.

A method of forming external electrodes according to the related art mainly uses a method of dipping the ceramic body in a paste including metal components. In this case, a multi-layer ceramic capacitor to be embedded in a board needs to have band surfaces of the external electrodes having a predetermined length or greater in order to connect the external electrode and the external wiring through the via hole. According to the dipping method according to the related art, the left and right band surfaces of may be thickly coated due to interfacial tension of the paste.

According to the exemplary embodiment of the present disclosure, as the conductive thin film layers 35 may be formed on the surfaces in the thickness direction T of the ceramic body 10, the conductive thin film layers 35 are used as plating seed layers, such that the band surfaces BW of the external electrodes 31 and 32 having a predetermined length or greater may be formed on the conductive thin film layers 35 so as to be flat and have a further reduced thickness by plating.

A method of forming the first and second base electrodes 31a and 32a is not particularly limited, and may be formed by applying the conductive paste including the conductive metal and then firing the same, for example. The first and second base electrodes 31a and 32a may be formed of the same conductive metal as the first and second internal electrodes 21 and 22, but is not limited thereto, and may be formed of copper (Cu), silver (Ag), nickel (Ni), or the like, or an alloy thereof, for example.

The first and second base electrodes 31a and 32a may be formed on both end surfaces of the ceramic body 10 in the length direction L and extended to cover corner portions connected to both surfaces in the thickness direction T.

The conductive thin film layers 35 may be formed on both surfaces of the ceramic body 10 in the thickness direction T, and may be formed to be separated from each other on both end portions of one end surface of the ceramic body 10 in the thickness direction T. The conductive thin film layers 35 may be formed so as to be connected to the first and second base electrodes 31a and 32a.

Referring to FIG. 3, according to the exemplary embodiments of the present disclosure, the conductive thin film layers 35 may be formed to be extended to the first and second base electrodes 31a and 32a from both surfaces of the ceramic body 10 in the thickness direction T.

A method of forming the conductive thin film layers 35 is not particularly limited, but may be formed by a sputtering method, or the like in order to form the conductive thin film layer 35 in a thin film shape. The conductive thin film layers 35 respectively formed in the thin film shape may have a thickness of 0.1 nm to 5000 nm. As the conductive thin film layers 35 are thinly formed in the above-mentioned range, the thickness of the band surface of the external electrode may be decreased and the thickness of the ceramic body 10 may be increased in an amount equal to the decreased thickness of the band surface, thereby improving strength. In the case in which the conductive thin film layers 35 have the thickness below 0.1 nm, it is difficult to uniformly form the conductive thin film layer and a cutting phenomenon may be caused, and in the case in which the conductive thin film layers 35 have the thickness exceeding 5000 nm, a time consumed for forming the conductive thin film layer may be unnecessarily increased.

The conductive thin film layers 35 may be formed of the same conductive metal as the first and second internal electrodes 21 and 22, but is not limited thereto, and may include copper (Cu), nickel (Ni), palladium (Pd), platinum (Pt), gold (Au), silver (Ag), iron (Fe), titanium (Ti), carbon (C), or the like, or an alloy thereof, for example.

The first and second plating layers 31b and 32b may be formed on the first and second base electrodes 31a and 32a and the conductive thin film layers 35 by using the first and second base electrodes 31a and 32a and the conductive thin film layers 35 as the plating seed layers.

The plating layers 31b and 32b may be formed of the same conductive metal as the first and second internal electrodes 21 and 22, but is not limited thereto, and may be formed of copper (Cu), silver (Ag), nickel (Ni), or the like, or an alloy thereof, for example.

When the thickness of the conductive thin film layers 35 is defined as tf and the thickness of the plating layers 31b and 32b formed on the conductive thin film layers 35 is defined as tp, $1.5 \leq tp/tf \leq 10000$ may be satisfied.

In the case in which the thickness of the conductive thin film layers 35 is extremely large or the thickness of the plating layers 31b and 32b is extremely small, such that tp/tf is below 1.5 and the thickness of the plating layers may not satisfy 5 μm which is an essential minimum thickness, and in the case in which the thickness of the conductive thin film layers 35 is extremely small or the thickness of the plating layers 31b and 32b is extremely large, such that tp/tf exceeds 10000, the overall thickness of the chip may be increased and exceed a thickness required for a MLCC chip to be embedded in a board or the thickness of the ceramic body may be relatively thin to thereby decrease the strength thereof.

Each of the widths BW of the band surfaces of the external electrodes 31 and 32 having the plating layers 31b and 32b formed on the conductive thin film layers 35 may be 25% or more of the length of the ceramic body 10. In the case in which the width of the band surface BW is less than 25% of the length of the ceramic body 10, defect occurrence probability may be increased during the processing of the via hole for connecting the external electrode to the external wiring.

The overall thickness tm of the multilayer ceramic capacitor 100 including the external electrodes 31 and 32 may be 300 μm or less, and the multilayer ceramic capacitor 100 is manufactured so as to have the overall thickness tm of 300 μm or less, such that it may be suitable for a multilayer ceramic capacitor to be embedded in a board.

In this case, the thickness ts of the ceramic body 10 may be 60% or more of the overall thickness tm of the multilayer ceramic capacitor including the external electrodes 31 and 32. In the case in which the thickness ts of the ceramic body 10 is less than 60% of the overall thickness tm of the multilayer ceramic capacitor, the strength of the chip becomes weak, such that defect such as damage may be caused.

Manufacturing Method of Multilayer Ceramic Electronic Component

In a manufacturing method of a multilayer ceramic electronic component to be embedded in a board according to an exemplary embodiment of the present disclosure, a plurality of ceramic green sheets may first be prepared by applying slurry including a barium titanate ($BaTiO_3$) powder and the like to carrier films and drying the same, thereby forming dielectric layers.

The slurry may be prepared by mixing a ceramic powder, a binder, and a solvent, and the slurry may be used to form the ceramic green sheet having a thickness of several μm by a doctor blade method.

Next, a conductive paste including a conductive metal power may be prepared. The conductive metal power may be nickel (Ni), copper (Cu), palladium (Pd), silver (Ag), lead (Pb), platinum (Pt), or the like, or an alloy thereof and may have a particle average size of 0.1 to 0.2 μm, such that the conductive paste for an internal electrode, including the conductive metal power of 40 to 50 wt % may be prepared.

The conductive paste for the internal electrode may be applied to the green sheets by a screen printing method to thereby form an internal electrode pattern. A method of printing the conductive paste may be a screen printing method, a gravure printing method, or the like, but the present disclosure is not limited thereto. The ceramic sheets having the internal electrode pattern printed thereon may be stacked in an amount of 200 to 300 layers, compressed, and then sintered, such that the ceramic body may be fabricated.

Next, the external electrodes may be formed so as to contact the internal electrodes exposed to both end surfaces in the length direction of the ceramic body and be electrically connected thereto.

Figure 4A:
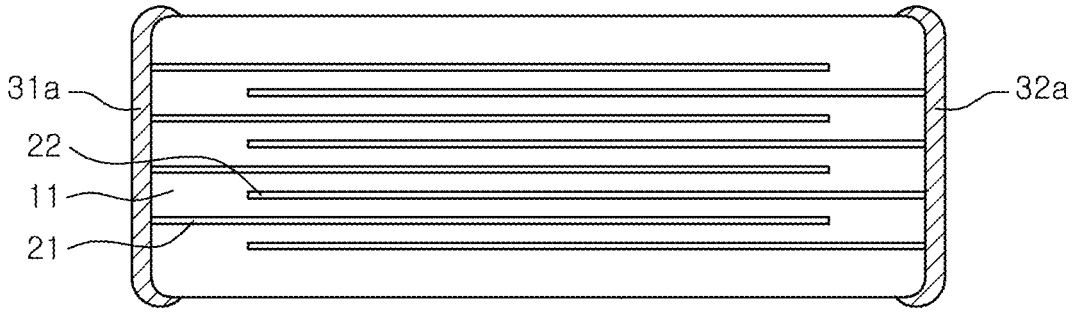
FIGS. 4A through 4C are cross-sectional views showing processes of forming external electrodes of the multilayer ceramic electronic component to be embedded in a board according to the exemplary embodiment of the present disclosure.
Figure 4B:
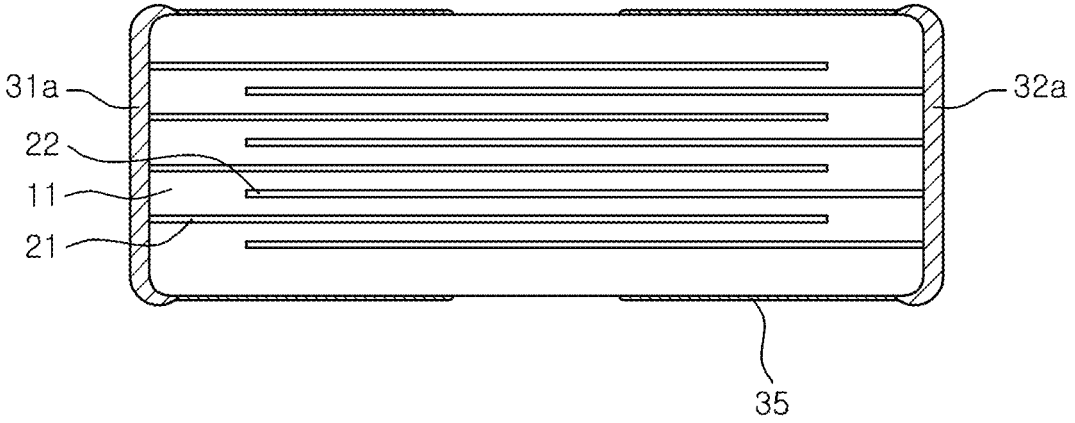
Figure 4C:
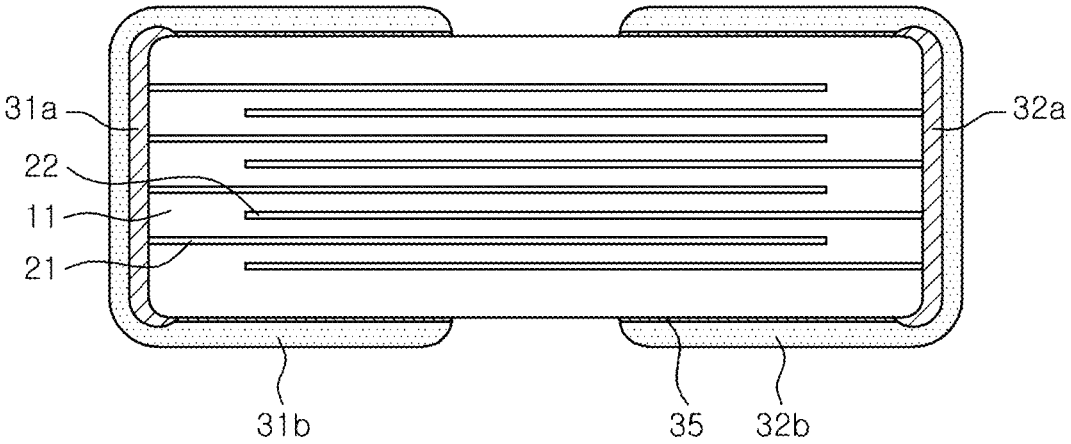
Figure 5:
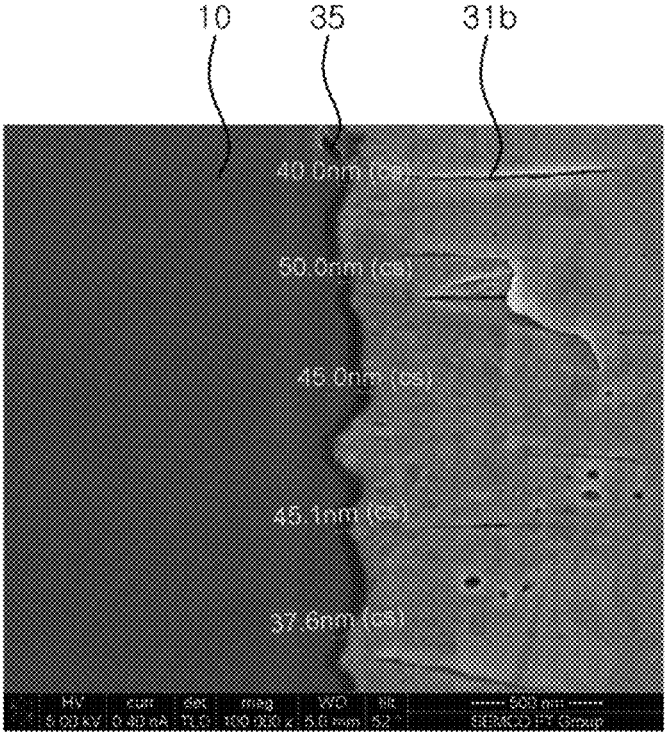
FIG. 5 is a photograph obtained by observing a conductive thin film layer formation portion of the multilayer ceramic electronic component to be embedded in a board according to the exemplary embodiment of the present disclosure by using a scanning electron microscope (SEM)

FIGS. 4A through 4C are cross-sectional views showing processes of forming external electrodes of the multilayer ceramic electronic component to be embedded in a board according to the exemplary embodiment of the present disclosure.

Referring to FIG. 4A, the first and second base electrodes 31a and 32a may be formed on both end surfaces of the ceramic body 10 in the length direction L.

A method of forming the first and second base electrodes 31a and 32a is not particularly limited, and may be formed by applying the conductive paste including the conductive metal by a dipping method, or the like, and then sintering the same, for example. The first and second base electrodes 31a and 32a may be formed of the same conductive metal as the first and second internal electrodes 21 and 22, but is not limited thereto, and may be formed of copper (Cu), silver (Ag), nickel (Ni), or the like, or an alloy thereof, for example.

When the first or second base electrodes 31a or 32a is formed by the dipping method, a distal portion of one end surface of the ceramic body 10 in the length direction L, corresponding to a surface to which the internal electrodes may be exposed, may be dipped at a minimum. Therefore, the first and second base electrodes 31a and 32a may be formed on both end surfaces of the ceramic body 10 in the length direction L and extended to cover corner portions connected to both surfaces in the thickness direction T thereof.

Referring to FIG. 4B, the conductive thin film layers 35 may be formed on both surfaces of the ceramic body 10 in the thickness direction T.

The conductive thin film layers 35 may be formed by a sputtering method, a printing method, an electroless plating method, or the like in order to form the conductive thin film layer 35 in a thin film shape, but the present disclosure is not limited thereto.

When the conductive thin film layers 35 are formed by the sputtering method, the conductive thin film layer 35 is first formed on one end surface of the ceramic body 10 in the thickness direction T and the conductive thin film layer 35 may be secondarily formed on the other end surface in the thickness direction T thereof.

The conductive thin film layers 35 may be formed after forming the first and second base electrodes 31a and 32a, and the conductive thin film layers 35 are first formed and the first and second base electrodes 31a and 32a may be then formed, but the order of forming the conductive thin film layers 35 is not particularly limited.

The conductive thin film layers 35 may be formed to be separated from each other on both end portions of one end surface of the ceramic body 10 in the thickness direction T, and each of the conductive thin film layers 35 may be formed to be connected to the first and second base electrodes 31a and 32a.

The conductive thin film layer 35 formed in the thin film shape may have a thickness of 0.1 nm to 5000 nm. As the conductive thin film layers 35 is thinly formed in the above-mentioned range, the thickness of the band surface of the external electrode may be decreased and the thickness of the ceramic body 10 may be increased in an amount equal to the decreased thickness of the band surface, thereby improving strength. In the case in which the conductive thin film layer 35 is formed to have the thickness below 0.1 nm, it is difficult to uniformly form the conductive thin film layer and a cutting phenomenon may be caused, and in the case in which the conductive thin film layer 35 is formed to have the thickness greater than 5000 nm, a time consumed for forming the conductive thin film layer may be unnecessarily increased.

The conductive thin film layers 35 may be formed of the same conductive metal as the internal electrodes, but is not limited thereto, and may include copper (Cu), nickel (Ni), palladium (Pd), platinum (Pt), gold (Au), silver (Ag), iron (Fe), titanium (Ti), carbon (C), or the like, or an alloy thereof, for example.

Referring to FIG. 4C, the plating layers 31b and 32b may be formed on the first and second base electrodes 31a and 32a and the conductive thin film layers 35.

The plating layers 31b and 32b having the thickness of 5 to 14 μm may be formed by using the first and second base electrodes 31a and 32a and the conductive thin film layers 35 as the plating seed layers.

The plating layers 31b and 32b may be formed of the same conductive metal as the internal electrodes, but present disclosure is not limited thereto, and the plating layers 31b and 32b may be formed of a material such as copper (Cu), silver (Ag), nickel (Ni), or the like, or an alloy thereof, for example.

When the thickness of the conductive thin film layers 35 is defined as tf and the thickness of the plating layers 31b and 32b formed on the conductive thin film layers 35 is defined as tp, $1.5 \leq tp/tf \leq 10000$ may be satisfied.

In the case in which the thickness of the conductive thin film layers 35 is extremely large or the thickness of the plating layers 31b and 32b is extremely small, such that tp/tf is below 1.5, the thickness of the plating layers may not satisfy 5 μm which is an essential minimum thickness, and in the case in which the thickness of the conductive thin film layers 35 is extremely small or the thickness of the plating layers 31b and 32b is extremely large, such that tp/tf exceeds 10000, the overall thickness of the chip may be increased and exceed the thickness required for a MLCC chip to be embedded in a board or the thickness of the ceramic body may be relatively thin to thereby decrease the strength.

As the conductive thin film layers 35 are formed and the plating layers 31b and 32b are formed on the conductive thin film layers 35, the band surface of the external electrodes 31 and 32 having the predetermined length or greater for connecting the via hole to the external electrodes may be formed so as to be flat and have a further reduced thickness.

A description of the same portions as the features of the multilayer ceramic electronic component according to the embodiment of the present disclosure described above will be omitted herein.

Printed Circuit Board Having Multilayer Ceramic Electronic Component

Figure 6:
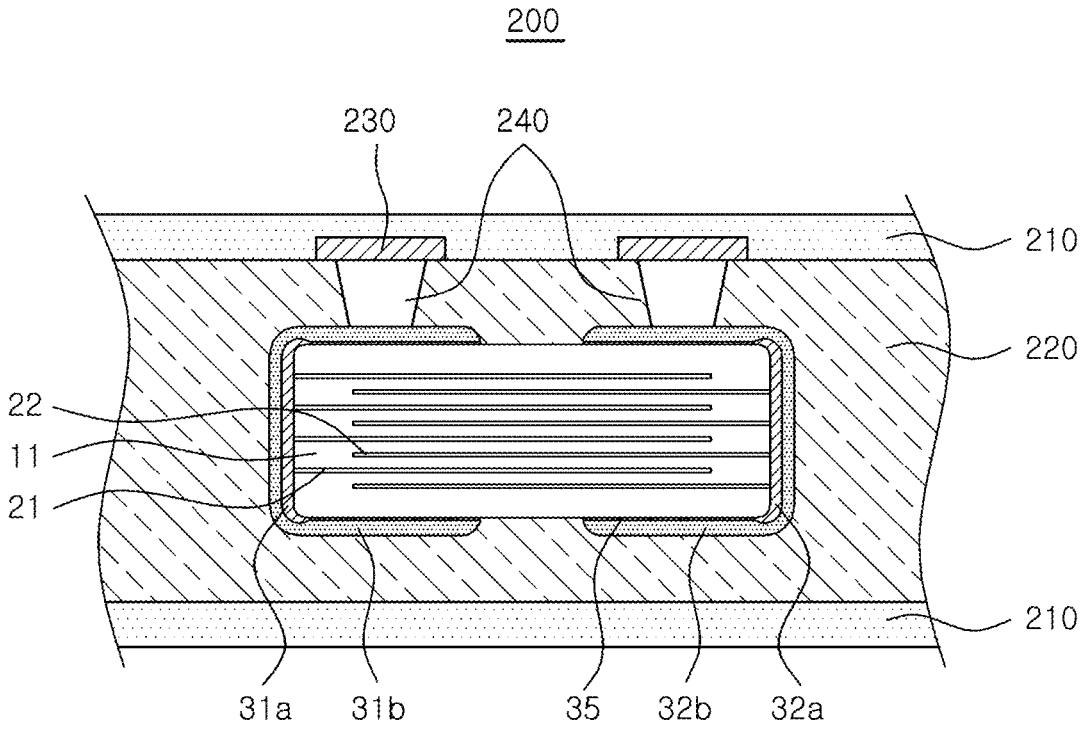
FIG. 6 is a cross-sectional view showing a printed circuit board having a multilayer ceramic electronic component to be embedded in a board according to an exemplary embodiment of the present disclosure.

FIG. 6 is a cross-sectional view showing a printed circuit board having a multilayer ceramic electronic component to be embedded in a board according to an exemplary embodiment of the present disclosure.

Referring to FIG. 6, a printed circuit board 200 having the multilayer ceramic electronic component to be embedded therein according to an exemplary embodiment of the present disclosure may include an insulation substrate 210, and the multilayer ceramic electronic component embedded in the insulation substrate 210.

The insulation substrate 210 may have a structure having an insulation layer 220 included therein, and may include a conductive pattern 230 and a conductive via hole 240 configuring an interlayer circuit having various forms as shown in FIG. 6, if necessary. The insulation substrate 210 may be the printed circuit board 200 including the multilayer ceramic electronic component therein.

The multilayer ceramic electronic component to be embedded in the board may include the ceramic body 10 including the dielectric layers 11 and having both end surfaces in the length direction L, both surfaces in the width direction W, and both surfaces in the thickness direction T; first and second internal electrodes 21 and 22 formed to be alternately exposed to the both end surfaces of the ceramic body 10 in the length direction L, having the dielectric layers 11 interposed therebetween; and a first external electrode 31 electrically connected to the first internal electrodes 21 and a second external electrode 32 electrically connected to the second internal electrodes 22, the first and second external electrodes being formed on both end surfaces of the ceramic body 10 in the length direction L, wherein the first and second external electrodes 41 and 42 may include the first and second base electrodes 31a and 32a formed on both end surfaces of the ceramic body 10 in the length direction L, the conductive thin film layers 35 formed on both surfaces of the ceramic body 10 in the thickness direction T, and the plating layers 31b and 32b formed on the first and second base electrodes 31a and 32a and the conductive thin film layers 35.

As the conductive thin film layer 35 is formed on the end surface in the thickness direction T of the ceramic body 10, the conductive thin film layer 35 is used as a plating seed layer, such that the band surfaces BW of the external electrodes 31 and 32 having the predetermined length or greater may be formed on the conductive thin film layer 35 so as to be flat and have a further reduced thickness with plating. Therefore, a step between the external electrode and the ceramic body may be decreased and an occurrence of de-lamination may be prevented.

A method of forming the conductive thin film layer 35 is not particularly limited, but may be formed by a sputtering method, or the like in order to form the conductive thin film layer 35 in a thin film shape. The conductive thin film layer 35 formed in the thin film shape may have a thickness of 0.1 nm to 5000 nm. As the conductive thin film layer 35 is thinly formed in the above-mentioned range, the thickness of the band surface of the external electrode may be decreased and the thickness of the ceramic body 10 may be increased in an amount equal to the decreased thickness of the band surface, thereby improving strength. In the case in which the conductive thin film layer 35 has the thickness below 0.1 nm, it is difficult to uniformly form the conductive thin film layer and a cutting phenomenon may be caused, and in the case in which the conductive thin film layer 35 has the thickness exceeding 5000 nm, a time consumed for forming the conductive thin film layer may be unnecessarily increased.

When the thickness of the conductive thin film layers 35 is defined as tf and the thickness of the plating layers 31b and 32b formed on the conductive thin film layers 35 is defined as tp, $1.5 \leq tp/tf \leq 10000$ may be satisfied.

In the case in which the thickness of the conductive thin film layers 35 is extremely large or the thickness of the plating layers 31b and 32b is extremely small, such that tp/tf is below 1.5, the thickness of the plating layers may not satisfy 5 μm which is an essential minimum thickness, and in the case in which the thickness of the conductive thin film layers 35 is extremely small or the thickness of the plating layers 31b and 32b is extremely large, such that tp/tf exceeds 10000, the overall thickness of the chip may be increased and exceed the thickness required for a MLCC chip embedded in a board or the thickness of the ceramic body may be relatively thin to thereby decrease the strength.

Each of the widths BW of the band surfaces of the external electrodes 31 and 32 having the plating layers 31b and 32b formed on the conductive thin film layer 35 may be 25% or more of the length of the ceramic body 10. In the case in which the width BW of the band surface is less than 25% of the length of the ceramic body 10, defect occurrence probability may be increased when the via hole 240 for connecting the external electrode and a conductive pattern 230 is processed.

Features other than the above-mentioned feature are the same as those of the multilayer ceramic electronic component according to the exemplary embodiment of the present disclosure described above. Therefore, a description thereof will be omitted.

As set forth above, in a multilayer ceramic electronic component to be embedded in a board according to exemplary embodiments of the present disclosure, a thickness of a ceramic body in an entire chip may be increased by decreasing a thickness of an external electrode while forming a band surface of the external electrode having a predetermined length or greater for connecting the external electrode to an external wiring through a via hole, such that the chip strength may be improved and the occurrence of damage such as breakage, or the like may be prevented.

In addition, the step generated in an amount equal to the thickness of the external electrode may be decreased, such that the occurrence probability of delamination may be decreased at the time of embedding the multilayer ceramic electronic component in the board.

While exemplary embodiments have been shown and described above, it will be apparent to those skilled in the art that modifications and variations could be made without departing from the spirit and scope of the present disclosure as defined by the appended claims.

What is claimed is:

1. A multilayer ceramic electronic component to be embedded in a board comprising:

a ceramic body including dielectric layers and having two end surfaces in a length direction, two surfaces in a width direction, and two surfaces in a thickness direction;

first and second internal electrodes formed to be alternately exposed to the two end surfaces of the ceramic body in the length direction, having the dielectric layers interposed therebetween; and a first external electrode electrically connected to the first internal electrodes and a second external electrode electrically connected to the second internal electrodes, the first and second external electrodes being formed on the two end surfaces of the ceramic body in the length direction, wherein the first and second external electrodes each include first and second base electrodes formed on the two end surfaces of the ceramic body in the length direction, a conductive thin film layer formed on each of *the* two surfaces of the ceramic body in the thickness direction, and plating layers formed on the first and second base electrodes and the conductive thin film layers, [and]

the conductive thin film layers of each of the first external electrode or the second external electrode are separate from each other,

*an average thickness of the conductive thin film layers is smaller than an average thickness of each of the first and second base electrodes,*

*when a thickness of the conductive thin film layers is defined as tf and a thickness of the plating layers formed on the conductive thin film layers is defined as tp,* $1.5 \leq tp/tf \leq 10000$ *is satisfied, and*

*when widths of band surfaces of the first and second external electrodes formed on the conductive thin film layers of one surface of the ceramic body in the*

*thickness direction are defined as BW, each of BW is 25% or more of a length of the ceramic body.*

2. The multilayer ceramic electronic component of claim 1, wherein the conductive thin film layers have a thickness of 0.1 to 5000 nm.

[3. The multilayer ceramic electronic component of claim 1, wherein when a thickness of the conductive thin film layers is defined as tf and a thickness of the plating layers formed on the conductive thin film layers is defined as tp, $1.5 \leq tp/tf \leq 10000$ is satisfied.]

4. The multilayer ceramic electronic component of claim 1, wherein the conductive thin film layers include at least one selected from a group consisting of copper (Cu), nickel (Ni), palladium (Pd), platinum (Pt), gold (Au), silver (Ag), iron (Fe), titanium (Ti), and carbon (C).

5. The multilayer ceramic electronic component of claim 1, wherein the conductive thin film layers are formed to be separated from each other on both end portions of one surface of the ceramic body in the thickness direction.

6. The multilayer ceramic electronic component of claim 1, wherein the conductive thin film layers are formed to be connected to the first and second base electrodes.

7. The multilayer ceramic electronic component of claim 1, wherein the conductive thin film layers are formed to be extended to the first and second base electrodes from the both surfaces of the ceramic body in the thickness direction.

[8. The multilayer ceramic electronic component of claim 1, wherein when widths of band surfaces of the first and second external electrodes formed on the conductive thin film layers of one surface of the ceramic body in the thickness direction are defined as BW, each of BW is 25% or more of a length of the ceramic body.]

9. The multilayer ceramic electronic component of claim 1, wherein the ceramic body has a thickness of 60% or more of an overall thickness of the multilayer ceramic electronic component including the external electrodes.

10. The multilayer ceramic electronic component of claim 1, wherein an overall thickness of the multilayer ceramic electronic component including the external electrodes is 300 μm or less.

11. A manufacturing method of a multilayer ceramic electronic component to be embedded in a board, the manufacturing method comprising:

preparing a plurality of ceramic sheets;

forming an internal electrode pattern on each of the ceramic sheets using a conductive paste;

forming a ceramic body including first and second internal electrodes opposed to each other therein by stacking the ceramic sheets having the internal electrode pattern formed thereon;

compressing and sintering the ceramic body; and forming first and second external electrodes to contact the first and second internal electrodes exposed to both end surfaces of the ceramic body in a length direction to thereby be electrically connected thereto, wherein in the forming of the first and second external electrodes, first and second base electrodes are formed on each of the both end surfaces of the ceramic body in the length direction, conductive thin film layers are formed on both surfaces of the ceramic body in a thickness direction, and plating layers are formed on the first and second base electrodes and the conductive thin film layers,

*an average thickness of the conductive thin film layers is smaller than an average thickness of each of the first and second base electrodes,* and the conductive thin film layers of each of the first external electrode or the second external electrode are formed to be separate from each other.

12. The method of claim 11, wherein the forming of the conductive thin film layers is performed by at least one method selected from a group consisting of a sputtering method, a printing method, and an electroless plating method.

13. The method of claim 11, wherein the conductive thin film layers have a thickness of 0.1 to 5000 nm.

14. The method of claim 11, wherein when a thickness of the conductive thin film layers is defined as tf and a thickness of the plating layers formed on the conductive thin film layers is defined as tp, $1.5 \leq tp/tf \leq 10000$ is satisfied.

15. The method of claim 11, wherein the conductive thin film layers include at least one selected from a group consisting of copper (Cu), nickel (Ni), palladium (Pd), platinum (Pt), gold (Au), silver (Ag), iron (Fe), titanium (Ti), and carbon (C).

16. The method of claim 11, wherein the conductive thin film layers are formed to be separated from each other on both end portions of one surface of the ceramic body in the thickness direction.

17. The method of claim 11, wherein the conductive thin film layers are formed to be connected to the first and second base electrodes.

18. A printed circuit board having a multilayer ceramic electronic component embedded therein, the printed circuit board comprising:

an insulation substrate; and a ceramic body including dielectric layers and having both end surfaces in a length direction, both surfaces in a width direction, and both surfaces in a thickness direction;

first and second internal electrodes formed to be alternately exposed to the both end surfaces of the ceramic body in the length direction, having the dielectric layers interposed therebetween; and a first external electrode electrically connected to the first internal electrodes and a second external electrode electrically connected to the second internal electrodes, the first and second external electrodes being formed on the both end surfaces of the ceramic body in the length direction, wherein the first and second external electrodes each include first and second base electrodes formed on the both end surfaces of the ceramic body in the length direction, conductive thin film layers formed on the both surfaces of the ceramic body in the thickness direction, and plating layers formed on the first and second base electrodes and the conductive thin film layers, [and]

the conductive thin film layers of each of the first external electrode or the second external electrode are separate from each other,

*an average thickness of the conductive thin film layers is smaller than an average thickness of each of the first and second base electrodes,*

*when a thickness of the conductive thin film layers is defined as tf and a thickness of the plating layers formed on the conductive thin film layers is defined as tp, $1.5 \leq tp/tf \leq 10000$ is satisfied, and*

*when widths of band surfaces of the first and second external electrodes formed on the conductive thin film layers of one surface of the ceramic body in the thickness direction are defined as BW, each of BW is 25% or more of a length of the ceramic body.*

19. The printed circuit board of claim 18, wherein the conductive thin film layers have a thickness of 0.1 to 5000 nm.

[20. The printed circuit board of claim 18, wherein when a thickness of the conductive thin film layers is defined as tf and a thickness of the plating layers formed on the conductive thin film layers is defined as tp, $1.5 \leq tp/tf \leq 10000$ is satisfied.]

21. The multilayer ceramic electronic component of claim 1, wherein the conductive thin film layers of the first external electrode or the second external electrode extend to cover only a portion of one of the two end surfaces of the ceramic body in the length direction.

22. The multilayer ceramic electronic component of claim 1, wherein the conductive thin film layers of the first external electrode are separate from each other, and the conductive thin film layers of the second external electrode are separate from each other.

23. The multilayer ceramic electronic component of claim 1, wherein the conductive thin film layers of the first external electrode extend to cover only a portion of one of the two end surfaces of the ceramic body in the length direction, and the conductive thin film layers of the second external electrode extend to cover only a portion of the other end surface of the ceramic body in the length direction.

* * * * *